United States Patent [19]
Sato

[11] Patent Number: 5,521,111
[45] Date of Patent: May 28, 1996

[54] PROCESS OF FABRICATING MEMORY CELL WITH A SWITCHING TRANSISTOR AND A TRENCH-STACKED CAPACITOR COUPLED IN SERIES

[75] Inventor: Natsuki Sato, Tokyo, Japan

[73] Assignee: NEC Corporation, Tokyo, Japan

[21] Appl. No.: 239,403

[22] Filed: May 6, 1994

[30]     Foreign Application Priority Data

May 10, 1993 [JP] Japan .................................... 5-107803

[51] Int. Cl.⁶ ............................ H01L 21/70; H01L 27/00
[52] U.S. Cl. .................. 437/52; 437/47; 437/60; 437/919
[58] Field of Search ..................... 437/47, 52, 60, 437/919; 257/304–308, 301–303

[56]            References Cited

U.S. PATENT DOCUMENTS 5,027,172  6/1991  Jeon ......................................... 257/303
5,334,547  8/1994  Nakamura ................................. 437/52

FOREIGN PATENT DOCUMENTS 365904  10/1991  Japan .

*Primary Examiner*—H. Jey Tsai
*Attorney, Agent, or Firm*—Sughrue, Mion, Zinn, Macpeak & Seas

[57]            ABSTRACT

A memory cell is implemented by a series combination of a field effect transistor and a trench-stacked type storage capacitor, and an accumulating electrode is held in contact with a source region of the field effect transistor through an extremely narrow gap between a side spacer on a gate electrode of the field effect transistor and an isolation layer extending along a primary trench nested with the source region, wherein the side spacer is formed from a deposited doped polysilicon film and the isolation layer is formed by thermally oxidizing a wall portion of the primary trench so that the extremely narrow gap is defined without lithographic techniques.

9 Claims, 7 Drawing Sheets

PROCESS OF FABRICATING MEMORY CELL WITH A SWITCHING TRANSISTOR AND A TRENCH-STACKED CAPACITOR COUPLED IN SERIES

FIELD OF THE INVENTION

This invention relates to a process of fabricating a memory cell of a dynamic random access memory device and, more particularly, to a process of fabricating a memory cell for storing data bits in a trench-stacked capacitor.

DESCRIPTION OF THE RELATED ART

A dynamic random access memory device stores data bits in the form of electric charge in storage capacitors. The memory cells incorporated in the dynamic random access memory device of the first generation are respectively equipped with planar-type storage capacitors, and impurity regions defined in the major surface of the semiconductor substrate respectively serve as the accumulation electrodes of the storage capacitors. While increasing the integration density of the memory cell array, the memory cells have been progressively scaled down. However, a small-sized storage capacitor accumulates only a small amount of electric charge, and the small amount of electric charge can produce a small potential difference on an associated bit line pair. Moreover, the small amount of electric charge is liable to be lost due to alpha-particles, and a soft error tends to take place. For this reason, the planar-type storage capacitor reaches the limit in view of the accumulation capability, and a trench-type storage capacitor is employed to store a data bit.

The trench-type storage capacitor extends from the major surface into the semiconductor substrate, and three-dimensionally accumulates electric charge. A trench-capacitor occupies a narrow area of 1 micron×1 micron, and extends over 2 to 5 microns into the semiconductor substrate. As a result, the manufacturer can increase the integration density of the memory cell array without the soft-error.

However, if the integration density of the memory cell array is further increased, the trench-type storage capacitor encounters a problem in loss of the electric charge accumulated therein. This is because of the fact that the trench-type storage capacitor is much closer to the adjacent trench-type storage capacitor, and depletion layers easily bridge the accumulating electrodes of the adjacent trench-capacitors over the extremely narrow gap. The punch-through phenomenon takes place, and the accumulated electric charge flows out.

Another reason for the loss of electric charge is the accumulating electrode exposed to the major surface of the semiconductor substrate. The electric charge is liable to flow out as a junction leakage current. Moreover, the trench-type capacitor is less resistive against the alpha-particles because of the deep penetration into the semiconductor substrate.

Thus, even the trench-type storage capacitor does not allow manufacturers to drastically increase the integration density.

Subsequently, a trench-stacked storage capacitor is proposed for the dynamic random access memory device in Japanese Patent Publication of Application (kokai) No. 3-65904. FIGS. 1 and 2 illustrate a typical example of the memory cell array having the respective trench-stacked storage capacitors, and the memory cells form parts of a memory cell array incorporated in an open-bit line type dynamic random access memory device. In FIG. 1, inter-level insulating films and a cell plate electrode are deleted so that the layout of the memory cells are easily understandable.

The memory cells are fabricated on a p-type silicon substrate 1, and switching transistors SW1, SW2, SW3 and SW4 and trench-stacked type storage capacitors CP1, CP2, CP3 and CP4 form in combination the memory cells. A thick field oxide layer 2 defines active areas for the memory cells, and thin gate oxide films 3 cover the active areas. Word lines 5a, 5b and 5c extend over the thick field oxide layer 2 and the thin gate oxide films 3, and the word lines 5a to 5c partially serve as gate electrodes of the switching transistors SW1 to SW4.

Heavily-doped n-type source regions 6a, 6b, 6c and 6d and heavily-doped n-type drain regions 7a, 7b, 7c and 7d are formed in the active regions in a self-aligned manner with the thick field oxide film 2 as well as the word lines 5a to 5c. The heavily-doped source and drain regions 6a to 6d and 7a to 7d form parts of the switching transistors SW1 to SW4.

A first inter-level insulating layer 8 of silicon oxide covers the thick filed oxide layer 2, the word lines 5a to 5c and the heavily-doped n-type source and drain regions 6a to 6d and 7a to 7d. Contact holes 9a, 9b, 9c and 9d are formed in the first inter-level insulating layer 8, and expose the heavily-doped n-type source regions 6a to 6d, respectively. Primary trenches 10a, 10b, 10c and 10d penetrate through the first inter-level insulating layer 8 and the thin gate oxide films 3 into the p-type silicon substrate 1, and are open at the upper surface of the first inter-level insulating layer 8.

The p-type silicon substrate 1 exposed to the primary trenches 10a to 10d is covered with insulating films 11, and the insulating films 11 are held in contact with the thick field oxide layer 2, the thin gate oxide films 3 and the first inter-level insulating layer 8. A conductive substance covers the insulating films 11, and defines secondary trenches in the respective trenches. The layers of the conductive substance serve as storage node electrodes 12a, 12b, 12c and 12d, and the storage node electrodes 12a to 12d are held in contact with the heavily-doped n-type source regions 9a to 9d, respectively. The storage node electrodes 12a to 12d further extend over the first inter-level insulating layer 8, and are partially overlapped with the word lines.

Dielectric films 13 respectively cover the storage node electrodes 12a to 12d, and extend along the secondary trenches. A cell plate electrode 14 is held in contact with the dielectric films 13, and is shared between the storage capacitors CP1 to CP4. The storage node electrodes 12a to 12d, the dielectric films 13 and the cell plate electrode 14 form in combination the trench-stacked type storage capacitors CP1 to CP4.

The cell plate electrode 14 over the heavily-doped n-type drain regions 7a to 7d is partially removed, and a second inter-level insulating layer 15 covers the cell plate electrode 14 and the exposed portions of the first inter-level insulating film 8. Contact holes 16 are formed in the first and second inter-level insulating layers 8 and 15, and expose the heavily-doped n-type drain regions 7a to 7d, respectively.

Bit lines 17 are formed on the second inter-level insulating layer 15, and are selectively held in contact with the heavily-doped n-type drain regions 7a to 7d through the contact holes 16.

Thus, the trench-stacked storage capacitors CP1 to CP4 are isolated from the p-type silicon substrate 1 by means of the insulating layers 11, and are free from the problems inherent in the prior art trench-type storage capacitors.

However, each of the trench-stacked type storage capacitors CP1 to CP4 occupies a larger amount of real estate than the trench-type storage capacitor, because the storage node electrode 12a, 12b, 12c or 12d requires the contact hole 9a, 9b, 9c or 9d for contacting with the heavily-doped n-type source region 6a, 6b, 6c or 6d. If a memory cell is designed under 0.5 micron design rules allowing masks to be misaligned between −0.05 micron and +0.05 micron, the gate electrode is 0.5 micron in width, the contact holes 7a to 7d/9a to 9d and the primary trenches 10a to 10d occupy respective areas of 0.5 micron×0.5 micron, the storage node electrodes 12a and 12b are spaced apart from the storage node electrodes 12c and 12d by 0.5 micron, respectively, and the storage node electrodes 12a and 12d are also spaced apart from the storage node electrodes 12b and 12c by 0.5 micron, respectively. The contact holes 7a and 7b and the contact holes 9a and 9b are spaced apart from the word line 5b by 0.2 micron, and the contact holes 9a to 9d are also spaced apart from the primary trenches 10a to 10d by 0.2 micron, respectively. The margin between the contact holes 9a to 9d and the associated storage node electrodes 12a to 12d is set to 0.2 micron, and the margin between the primary trenches 10a to 10d and the associated storage node electrodes 12a to 12d is also set to 0.2 micron. The area occupied by each memory cell measures 2.8 microns in the direction of the bit line 17 and 1.4 microns in the direction of the word line 5b or 5c.

On the other hand, if the trench-type storage capacitor is designed under the same design rules, the trench is spaced from the word line or the gate electrode by 0.3 micron, and the area occupied by the memory cell measures 2.2 microns in the direction of the bit line and 1.4 microns in the direction of the word line. Thus, the area is 0.6 micron shorter in the direction of the bit line than the area for the memory cell with the trench-stacked type storage capacitor, and the contact holes 9a to 9d surely increases the occupation area of the memory cell.

SUMMARY OF THE INVENTION

It is therefore an important object of the present invention to provide a process of fabricating a memory cell with a trench-stacked type storage capacitor which occupies a smaller amount of area.

To accomplish the object, the present invention proposes to define a contact hole between a source region and an accumulating electrode by controlling film thicknesses of a side spacer and an insulating film covering a primary trench.

In accordance with an aspect of the present invention, there is provided a process of fabricating a memory cell having a switching transistor and a trench-stacked type storage capacitor coupled in series with the switching transistor, comprising the steps of: a) preparing a semiconductor substrate of a first conductivity type having an active area on a major surface thereof; b) fabricating the switching transistor on the active area, the switching transistor having a gate insulating film covering a part of the active area, a gate electrode formed on the gate insulating film and overlain by a first insulating film, a source region of a second conductivity type opposite to the first conductivity type and a drain region of the second conductivity type, the source region and the drain region being formed on both sides of the part of the active area, respectively; c) depositing a second insulating film on the entire surface, the second insulating film extending over the source region, a side surface of the gate electrode and the first insulating film; d) anisotropically etching the second insulating film until the source region is exposed, a side spacer being formed from the second insulating film, the side spacer covering the side surface of the gate electrode over the source region; e) depositing a first conductive layer extending along the side spacer and held in contact with the source region; f) providing a mask structure exposing a part of the first conductive layer over a part of the source region; g) successively etching the first conductive layer, the source region and the semiconductor substrate by using the mask structure for forming a primary trench nested with the source region; h) growing an isolation layer on a wall portion defining the primary trench, a peripheral surface of the source region exposed to the primary trench and a peripheral surface of the first conductive layer also exposed to the primary trench, the first conductive layer being held in contact with the source region through a narrow gap between the side spacer and the isolation layer; i) removing the mask structure for exposing the first conductive layer; j) completing an accumulating electrode partially in the secondary trench, the first conductive layer forming a part of the accumulating electrode; l) covering the accumulating electrode with a dielectric film structure; and m) forming a cell plate electrode held in contact with the dielectric film structure for completing the trench-stacked type storage capacitor.

BRIEF DESCRIPTION OF THE DRAWINGS

The features and advantages of the process according to the present invention will be more clearly understood from the following description taken in conjunction with the accompanying drawings in which.

DESCRIPTION OF THE PREFERRED EMBODIMENTS

First Embodiment

Figure 1:
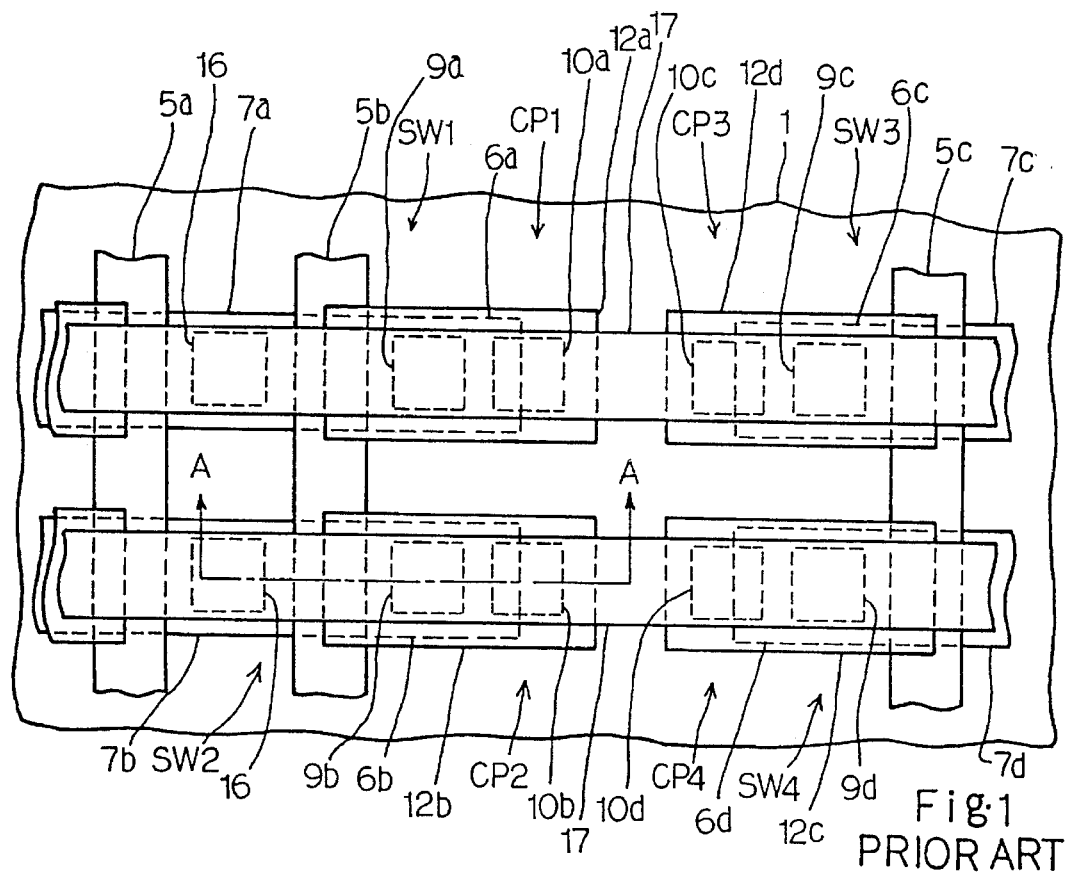
FIG. 1 is a schematic plan view showing the prior art memory cells with the trench-stacked type storage capacitors.
Figure 2:
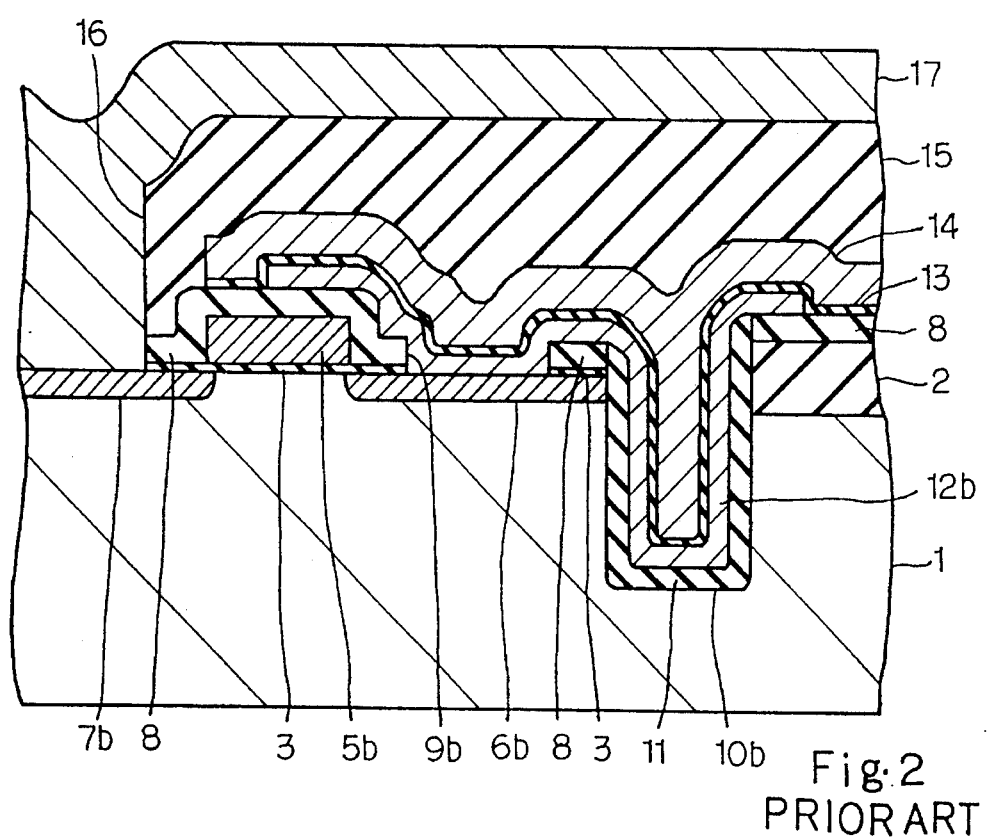
FIG. 2 is a cross sectional view taken along line A—A of FIG. 1 and showing the structure of the prior art memory cell.
Figure 3:
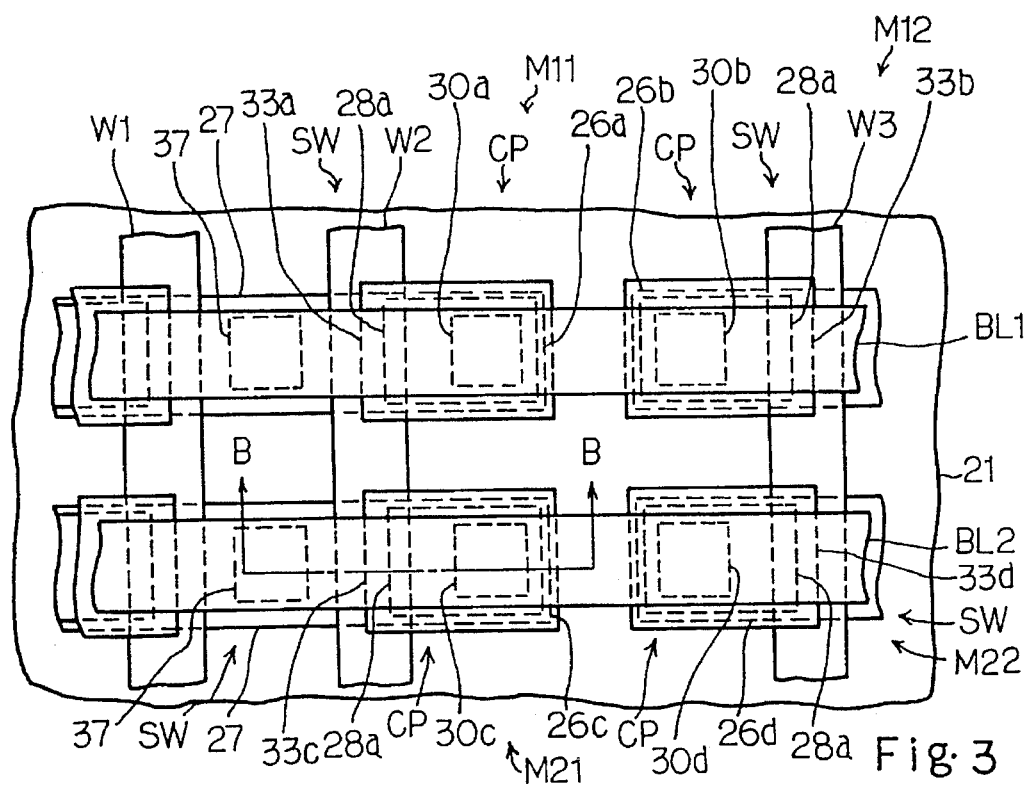
FIG. 3 is a schematic plan view showing the layout of a part of a memory cell array incorporated in a dynamic random access memory device according to the present invention.
Figure 4:
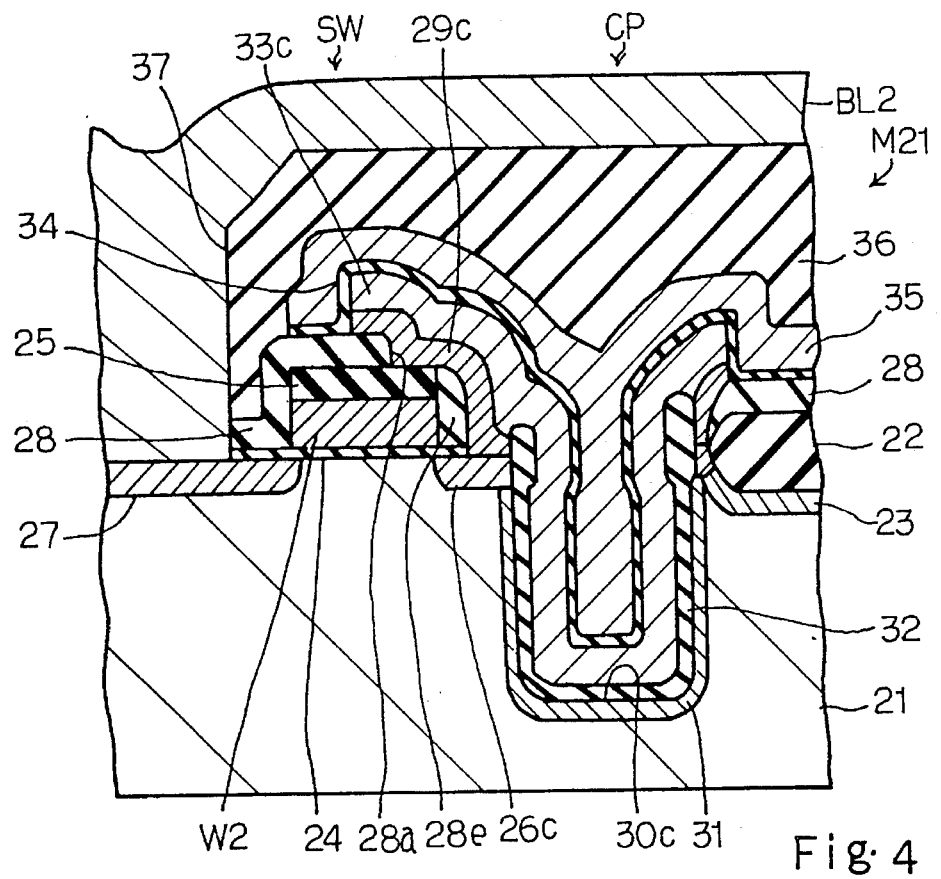
FIG. 4 is a cross sectional view taken along line B—B of FIG. 3 and showing the structure of the memory cell.

Referring to FIGS. 3 and 4 of the drawings, memory cells M11, M12, M21 and M22 incorporated in a dynamic random access memory device embodying the present invention are fabricated on a p-type silicon substrate 21, and each of the memory cells M11 to M22 is implemented by a combination of an n-channel enhancement type switching transistor SW and a trench-stacked type storage capacitor CP. An open-bit line system is incorporated in the dynamic random access memory device, and is designed on 0.5 micron design rules. The 0.5 micron design rules only allow a mask alignment ±0.05 micron. Inter-level insulating films and a cell plate electrode are deleted from the layout in FIG. 3 for better understanding.

The major surface of the p-type silicon substrate 21 is covered with a field oxide film 22 of 0.4 micron to 0.6 micron thick, and the thick field oxide film 22 defines active areas respectively assigned to the memory cells M11, M12, M21 and M22 respectively paired with other memory cells (not shown). A heavily doped p-type channel stopper region 23 is formed beneath the thick field oxide film 22, and the active areas are respectively covered with thin gate oxide films 24 of 10 to 15 nanometers thick.

Word lines W1, W2 and W3 extend on the thick filed oxide film 22, and pass over the thin gate oxide films 24 for serving as gate electrodes of the n-channel enhancement type switching transistors SW. In this instance, the word lines W1 to W3 are implemented by heavily-doped n-type polysilicon films of 200 nanometers thick, respectively, and the word lines W1 to W3 are regulated to 0.5 micron in width. For this reason, the gate length of each n-channel enhancement type switching transistor SW is 0.5 micron. Refractory metal layers, refractory metal silicide layers and polyside layers are available for the word lines W1 to W3. The word lines W1 to W3 are covered with a first inter-level insulating film 25 of silicon oxide deposited to 100 nanometers thick.

In the active areas are formed heavily-doped n-type source regions 26a, 26b, 26c and 26d and heavily-doped n-type drain regions 27 which are self-aligned with the thick field oxide film 22 as well as with the word lines W1 to W3. The heavily-doped n-type source regions 26a to 26d and the heavily-doped n-type drain regions 27 are 0.8 micron in width or in a direction parallel to the gate width, and are 0.2 micron in depth. The heavily-doped n-type source region 26c is spaced apart from the adjacent heavily-doped n-type source regions 26a and 26d by 0.6 micron, and the heavily-doped n-type drain regions 27 are spaced apart from one another by 0.6 micron.

A second inter-level insulating film 28 of silicon oxide covers the thick field oxide film 22, the word lines W1 to W3, the heavily-doped n-type source regions 26a to 26d and the heavily-doped n-type drain regions 27, and is 100 nanometers in thickness. Contact holes 28a are formed in the second inter-level insulating film 28, and expose the heavily-doped n-type source regions 26a to 26d and parts of the first inter-level insulating film 25. While the contact holes 28a are being formed, side spacers 28e are left on the side surfaces of the gate electrodes forming parts of the word lines W1 to W3.

First storage node electrodes (shown as 29c in FIG. 4, but not illustrated with respect to memory cells M11, M12, and M22) extend from the heavily-doped n-type source regions 26a to 26d over the side spacers 28e and the exposed portions of the first inter-level insulating film 25 to the second inter-level insulating film 28 partially overlapped with the first inter-level insulating film 25. In other words, the first storage node electrodes close the contact holes 28a, respectively. The first storage node electrodes are implemented by heavily-doped n-type polysilicon layers of 50 nanometers thick, and are held in contact with the heavily-doped n-type source regions 26a to 26d in a self-aligned manner, respectively.

Primary trenches 30a, 30b, 30c and 30d respectively penetrate through the first storage node electrodes and the heavily-doped n-type source regions 26a to 26d into the p-type silicon substrate 21, and heavily-doped p-type channel stoppers 31 are formed along the wall portions of the p-type silicon substrate 21 defining the primary trenches 30a to 30d. The heavily-doped p-type channel stoppers 31 are merged with the heavily-doped p-type channel stopper 23.

Each of the primary trenches 30a to 30d occupies a small area of 0.5 micron×0.5 micron, and the depth of each primary trench is 3 microns. The primary trenches 30a to 30d are laterally spaced apart from the word lines W2 and W3 by 0.3 micron, and the margin between the primary trenches 30a to 30d and the associated heavily-doped n-type source regions 26a to 26d is about 0.15 micron.

The primary trenches 30a to 30d are covered with an isolation films 32 of silicon oxide, and the isolation films 32 define secondary trenches in the primary trenches. Each of the isolation films 32 is of the order of 50 nanometers thick on the heavily-doped p-type channel stopper regions 31. Each of the isolation films 32 is increased in thickness around the periphery thereof, and is about 100 nanometer thick on the heavily-doped n-type source region 26a/26b/26c/26d and the first storage node electrode.

The heavily-doped p-type channel stoppers 31 are not indispensable. However, if the memory cells M11 to M22 are scaled down, the primary trenches 30a to 30d are miniaturized, and the isolation films 32 are decreased in thickness. In this situation, the heavily-doped p-type channel stoppers 31 are effective against the punch-through phenomenon due to the depletion layers.

Second storage node electrodes 33a, 33b, 33c and 33d conformally extend on the isolation layers 32 and the associated first storage node electrodes, and project from the secondary trenches over the first storage node electrodes. The second storage node electrodes 33a to 33d are electrically connected through the associated first storage node electrodes with the heavily-doped n-type source regions 26a to 26d, respectively. Extremely narrow openings are defined between the side spacers 28e and the peripheries of the isolation films 32 on the heavily-doped n-type source regions 26a to 26d, respectively, because the thickness of each side spacer 28e and the thickness of the isolation film 32 are precisely controllable rather than the lithographic techniques. As a result, the first storage node electrodes obliquely extending over the side spacers 28e electrically contact the second storage node electrodes 33c with the heavily-doped n-type source regions 26a to 26d.

In this instance, the second storage node electrodes 33a to 33d are formed of heavily-doped n-type polysilicon with thickness of 100 nanometers. However, refractory metal films and refractory metal silicide films are available for the second storage node electrodes 33a to 33d. Each of the second storage node electrodes 33a to 33d is formed over the major surface of 1.1 micron×0.9 micron. The second storage node electrode 33c is spaced apart from the second storage node electrodes 33a and 33d by 0.5 micron, and the edges of the second storage node electrode 33c are aligned with the edges of the second storage node electrode 33a and the edges of the second storage node electrode 33d.

The second storage node electrodes 33a to 33d and the exposed surfaces of the first storage node electrodes are covered with dielectric film structures 34, and the dielectric film structures 34 in turn are covered with a cell plate electrode 35. Each of the dielectric film structures 34 may be implemented by a single insulating film or a plurality of insulating films, and the cell plate electrode 35 has openings over the heavily-doped n-type drain regions 27.

The heavily-doped n-type source regions 26a to 26d, the heavily-doped n-type drain regions 27, the gate oxide film 24 and the parts of the word lines W1 to W2 form in combination the n-channel enhancement type switching transistors SW of the memory cells M11 to M22, and the first storage node electrodes, the second storage node electrodes 33a to 33d, the dielectric film structures 34 and the cell plate electrodes as a whole constitute the trench-stacked type storage capacitors CP of the memory cells M11 to M22.

The cell plate electrode 35 is covered with an inter-level insulating film 36 of silicon oxide, and contact holes 37 are formed in the inter-level insulating film 36 in such a manner as to expose the heavily-doped n-type drain regions 27. Each of the contact holes 37 measures 0.5 micron by 0.5 micron. The margin between the contact hole 37 and each word line W1 or W2 is 0.2 micron, and the margin between the contact hole 37 the associated heavily-doped n-type drain region 27 is 0.15 micron.

Bit lines BL1 and BL2 extend on the inter-level insulating film 36, and pass through the contact holes 37 so as to be brought into contact with the heavily-doped n-type drain regions 27.

The first and second storage node electrodes (29c and 33c, in FIG. 4) serve as an accumulation electrode of the trench-stacked type storage capacitor, and the accumulation electrode is electrically isolated from the p-type silicon substrate 21 by means of the heavily-doped p-type channel stopper 31 and the isolation film 32, and a punch-through phenomenon never takes place between the adjacent trench-stacked type storage capacitors CP. Moreover, the heavily-doped p-type channel stopper 31 and the isolation film 32 do not allow a leakage current to flow into the p-type silicon substrate 21. For this reason, the trench-stacked type storage capacitors according to the present invention can maintain electric charges for long time period. Moreover, since the trench-stacked type storage capacitors according to the present invention are perfectly isolated from the p-type silicon substrate 21, a soft error rarely takes place.

Thus, the trench-stacked type storage capacitors CP according to the present invention have all of the advantages of the prior-art trench-stacked type storage capacitors, and, moreover, occupy smaller areas than the prior-art trench-stacked type storage capacitors by virtue of the extremely narrow openings defined by the side spacers 28e and the isolation films 32. In fact, each of the memory cells M11 to M22 occupies a real estate of 2.2 microns×1.4 microns, and the occupation area is as narrow as that of the prior art trench type storage capacitor.

Description is hereinbelow made on a process sequence for fabricating the memory cells with reference to FIGS. 5A to 5E. The process sequence starts with preparation of the p-type silicon substrate 21. Although the process sequence concurrently fabricates the memory cells M11 to M22, the description is focused on the memory cell M21, and, for this reason, the description refers to layers and regions of the memory cell M21 only.

First, the heavily-doped p-type channel stopper 23 and the thick filed oxide film 22 are formed on the major surface of the p-type silicon substrate by using conventional techniques. The heavily-doped p-type channel stopper 23 and the thick filed oxide film 22 define the active area assigned to the memory cell M21, and electrically isolate the active area from other active areas assigned to other component elements.

Subsequently, the active area is thermally oxidized for growing the thin gate oxide film 24. Heavily-doped n-type polysilicon is deposited over the entire surface of the structure for forming a heavily-doped n-type polysilicon film, and silicon oxide is in turn deposited over the heavily-doped n-type polysilicon film for forming a silicon oxide film.

The silicon oxide film and the heavily-doped n-type polysilicon film are successively patterned into the word line W2 and the first inter-level insulating film 25 by using lithographic techniques. The word line W2 partially serves as the gate electrode of the n-channel enhancement type switching transistor SW forming a part of the memory cell M21, and the first inter-level insulating film 25 remains on the upper surface of the word line W2.

Using the thick filed oxide film 22 and the first inter-level insulating film 25 as a mask, arsenic atoms are implanted into the active area so as to form the heavily-doped n-type source region 26c and the heavily-doped n-type drain region 27 on both sides of the gate electrode.

Silicon oxide is deposited on the entire surface of the structure to suitable thickness by using a chemical vapor deposition technique, and a silicon oxide film covers the structure. Photo-resist solution is spun onto the entire surface of the silicon oxide film, and the photo-resist film is patterned into a photo-resist mask 41. The photo-resist mask 41 exposes the heavily-doped n-type source region 26c and the silicon oxide film on a part of the first inter-level insulating film 25. The silicon oxide film is anisotropically etched away until the heavily-doped n-type source region 26c is exposed. Then, the side spacer 28e is left on the side surface of the gate electrode, and the second inter-level insulating film 28 remains beneath the photo-resist mask 41.

Figure 5A:
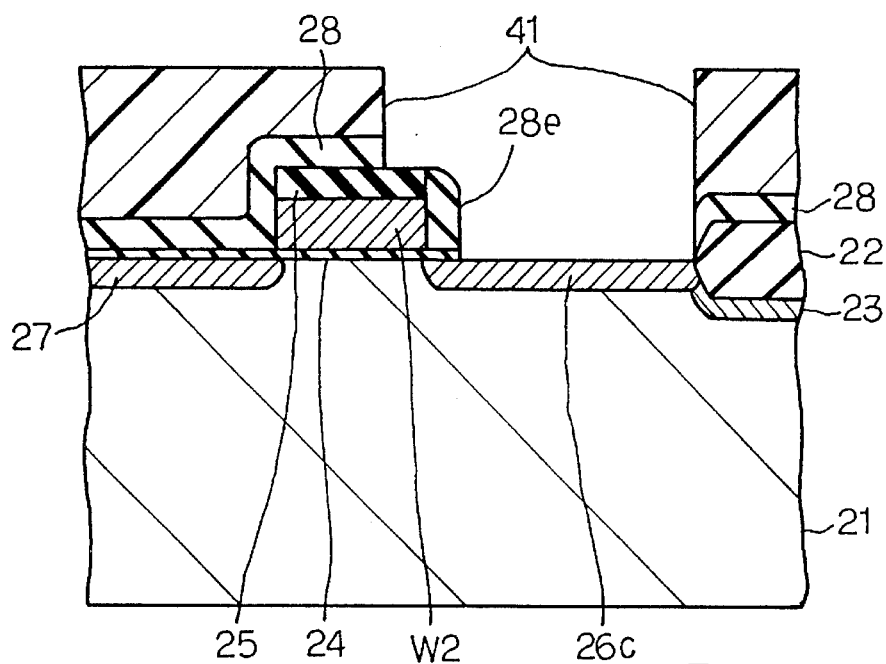
FIGS. 5A to 5E are cross sectional views taken along line B—B of FIG. 3 and showing essential stages of a process sequence according to the present invention.

The side spacer 28e projects from the side surface of the gate electrode. Thus, the position of the side spacer 28e is precisely determined through the chemical vapor deposition followed by the anisotropical etching. Since the first inter-level insulating film 25 is much thicker than the thin gate oxide film 24, the gate electrode is never exposed. The gate electrode is enclosed by the second inter-level insulating film 28, the first inter-level insulating film 25, the thin gate oxide film 24 and the side spacer 28e. The resultant structure of this stage is illustrated in FIG. 5A.

The photo-resist mask 41 is stripped off, and heavily-doped n-type polysilicon, silicon oxide, silicon nitride and silicon oxide are successively deposited over the entire surface of the structure to thicknesses of 50 nanometers, 20 nanometers, 20 nanometers and 300 nanometers so as to cover the entire surface with a heavily-doped n-type polysilicon film 42, a silicon nitride film 43 sandwiched between silicon oxide films 44 and 45. The silicon nitride film 43 and the silicon oxide film 44 serve as a composite mask structure against oxidation.

Photo-resist solution is spun onto the silicon oxide film 45, and the photo-resist film is patterned into a photo-resist mask 46 through the lithographic techniques. The composite mask structure forms a mask structure together with the silicon oxide film 45 and the photo-resist mask 46. The photo-resist mask 46 exposes a part of the silicon oxide film 45 over an area assigned to the primary trench 30c.

Using the photo-resist mask 46, the silicon oxide film 45, the silicon nitride film 43, the silicon oxide film 44, the heavily-doped n-type polysilicon film 42 and the p-type silicon substrate 21 are successively etched away, and the generally U-shaped primary trench 30c is formed in the p-type silicon substrate 21. The photo-resist mask 46 defines not only the primary trench 30c but also the edge of the heavily-doped n-type polysilicon film 42, and the edge of the heavily-doped n-type polysilicon film 42 is self-aligned with the primary trench 30c.

Figure 5B:
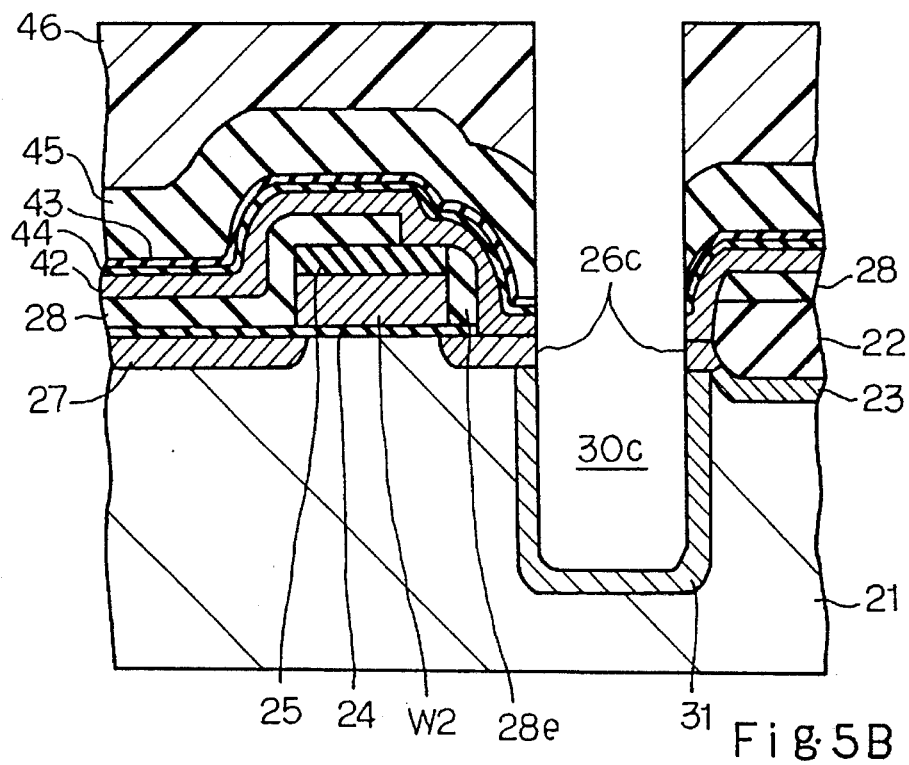

The p-type silicon substrate 21 is driven for rotation, and boron atoms are obliquely implanted into the p-type silicon substrate 21 at dose of $10^{13}$ cm$^{-2}$. Then, the heavily-doped p-type channel stopper region 31 is formed along the wall portion defining the primary trench 30c as shown in FIG. 5B.

The photo-resist mask 46 is stripped off, and the silicon oxide film 45 is removed from the structure. The heavily-doped p-type channel stopper region 31, the exposed surface of the heavily-doped n-type source region 26c and the edge portion of the heavily-doped n-type polysilicon film 42 are thermally oxidized, and the silicon nitride film 43 prevents the heavily-doped n-type polysilicon film 42 therebeneath from the thermal oxidation. The oxidized portions form the isolation layer 32 defining the secondary trench.

Figure 5C:
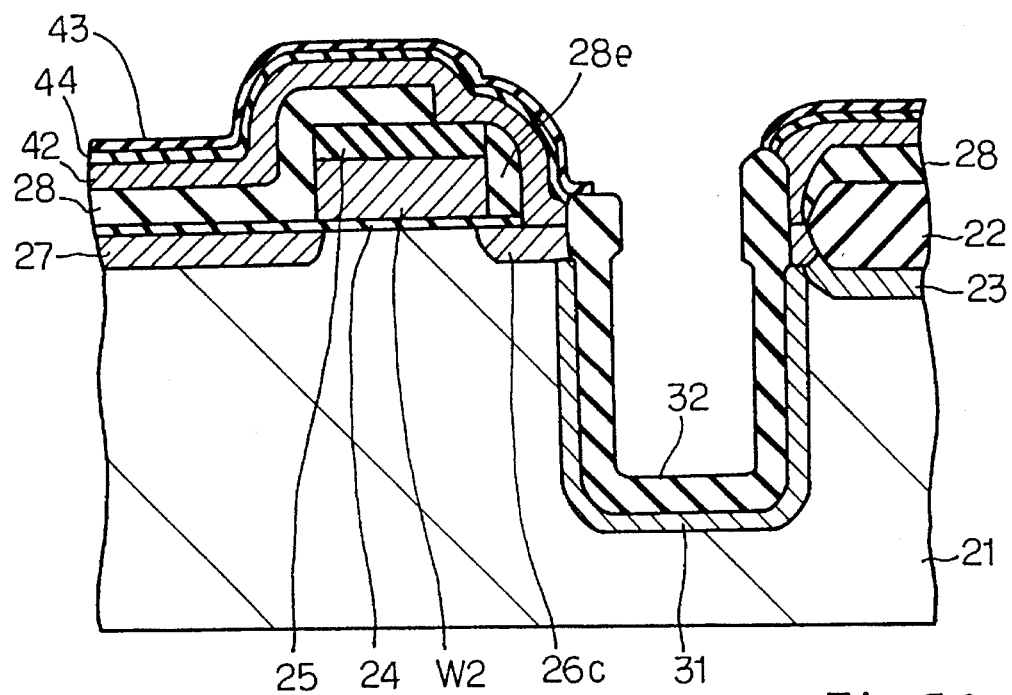

Although the isolation layer 32 on the heavily doped p-type channel stopper region 31 is about 100 nanometers in thickness, the n-type impurities accelerate the thermal oxidation, and the isolation layer 32 on the source region 26c and the polysilicon film 42 is grown to thickness of 150 nanometers as shown in FIG. 5C.

Figure 5D:
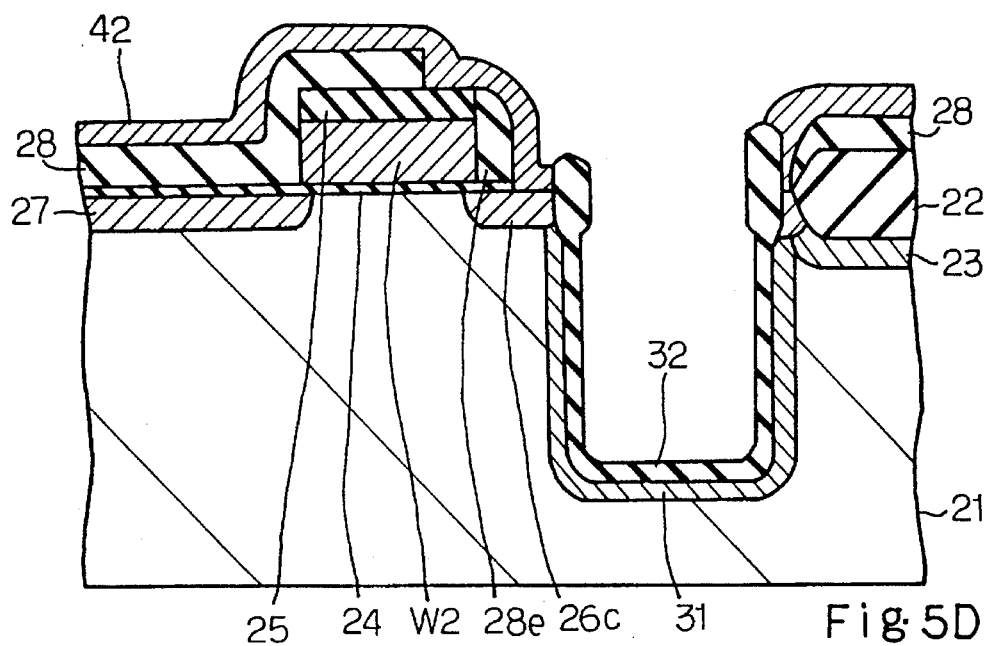

The silicon nitride film 43 is removed through a wet etching, and the silicon oxide film 44 is isotropically etched away. While the silicon oxide film 44 is being etched, the etchant partially removes the isolation layer 32, and the isolation layer 32 is decreased in thickness by 50 nanometers. The resultant structure of this stage is illustrated in FIG. 5D.

Thus, an extremely narrow gap is formed between the side spacer 28e and the periphery of the isolation layer 32 without lithographic techniques.

Figure 5E:
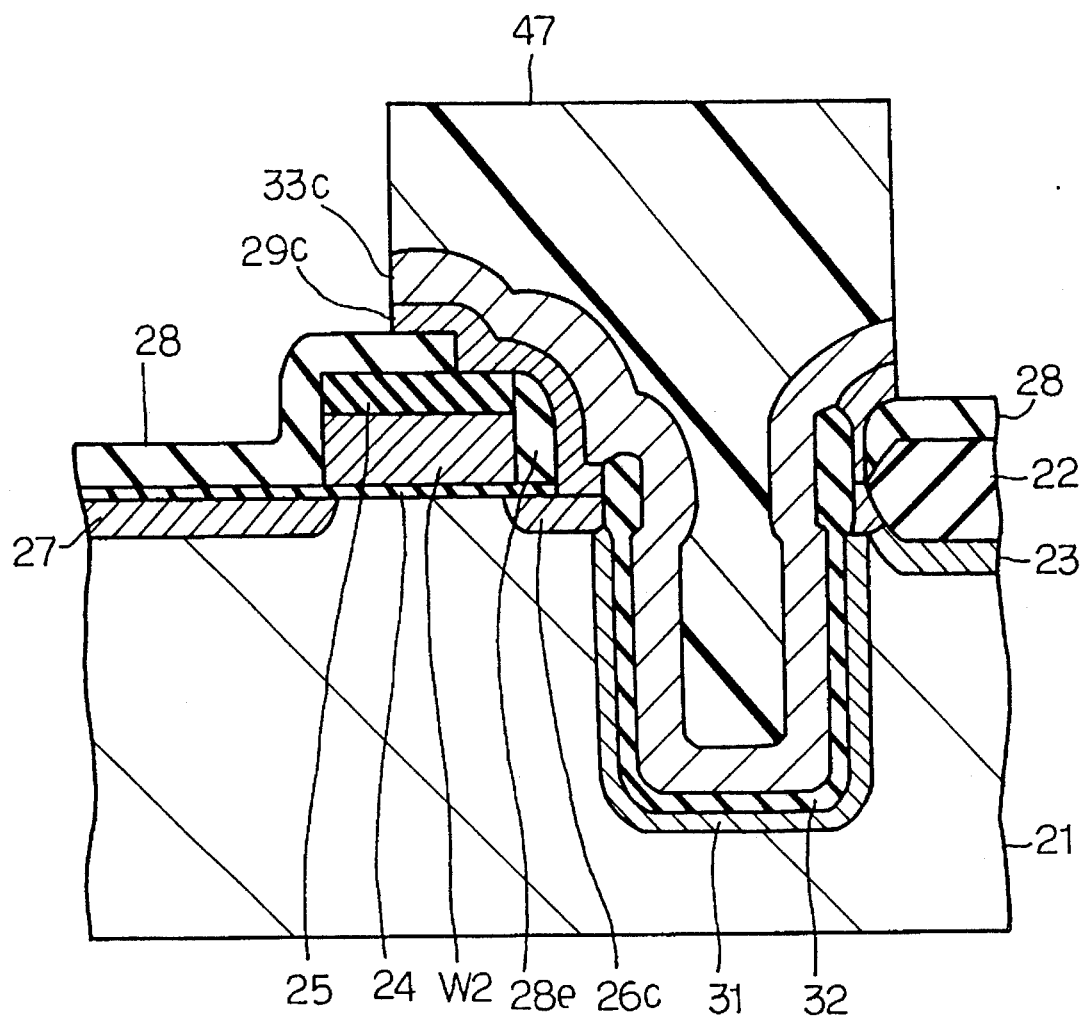

Heavily-doped n-type polysilicon is deposited over the entire surface of the structure for forming a heavily-doped n-type polysilicon film, and the heavily-doped n-type polysilicon film extends along the isolation layer 32 and the heavily-doped n-type polysilicon layer 42. Photo-resist solution is spun onto the entire surface of the structure, and the photo-resist film is patterned into a photo-resist mask 47 as shown in FIG. 5E.

Using the photo-resist mask 47, the heavily-doped polysilicon films are partially removed so as to form the first storage node electrode 29c and the second storage node electrode 33c. The first and second storage node electrodes 29c and 33c form in combination the accumulating electrode of the trench-stacked type storage capacitor CP.

Dielectric substance is deposited over the entire surface of the structure for forming a dielectric film, and heavily doped n-type polysilicon is deposited over the dielectric film for forming the heavily-doped n-type polysilicon layer. An appropriate mask is provided on the heavily-doped n-type polysilicon layer, and the heavily-doped n-type polysilicon layer and the dielectric film are partially etched away for forming the dielectric film structure 34 and the cell plate electrode 35.

The inter-level insulating layer 36 is formed through an appropriate deposition technique over the entire surface, and the inter-level insulating layer 36, the second inter-level insulating film 28 and the gate oxide film 24 are partially etched away by using the lithographic techniques so that the contact hole 37 is formed in the inter-level insulating layer 36. The contact hole 37 exposes the heavily-doped n-type drain region 27.

Finally, an appropriate conductive substance is deposited on the inter-level insulating layer 36, and the conductive layer passes through the contact hole 37 so as to be held in contact with the heavily-doped drain region 27. The conductive layer is patterned into the bit line BL2 through the lithographic techniques, and the memory cell M21 is completed as shown in FIG. 4.

In this instance, the isolation layer 32 is implemented by the thermally oxidized silicon oxide film. However, a silicon nitride film may be available for the isolation layer 32. In order to form the silicon nitride film along the heavily-doped p-type channel stopper region 31, silicon nitride is deposited over the entire surface after removing the silicon oxide film 45 by using a low-pressure chemical vapor deposition technique, then covering the entire surface with a photo-resist layer, then uniformly etching the photo-resist layer for leaving the photoresist in the secondary trench defined by the silicon nitride only, then etching away the exposed silicon nitride film 43 and the exposed silicon oxide film 44, finally removing the photo-resist in the secondary trench. If the isolation layer 32 of silicon nitride is formed through the deposition, the isolation layer 32 is substantially uniform in thickness.

As will be understood from the foregoing description, the process sequence according to the present invention forms the extremely narrow gap between the side spacer 28e and the isolation layer 32, and fabricates the trench-stacked type storage capacitor on a smaller amount of real estate.

Second Embodiment

Another dynamic random access memory device embodying the present invention is similar to that of the first embodiment except for the structure of accumulating electrodes, and, for this reason, the same references used for the first embodiment are used for layers and regions of the second embodiemnt corresponding to those of the first embodiment.

The difference between the first embodiment and the second embodiemnt is derived from a process sequence for fabricating the dynamic random access memory device implementing the second embodiemnt, and description is hereinbelow made on the process sequence with reference to FIGS. 6A and 6B.

The process sequence implementing the second embodiment is similar to the first embodiemnt unit the structure shown in FIG. 5D.

Figure 6A:
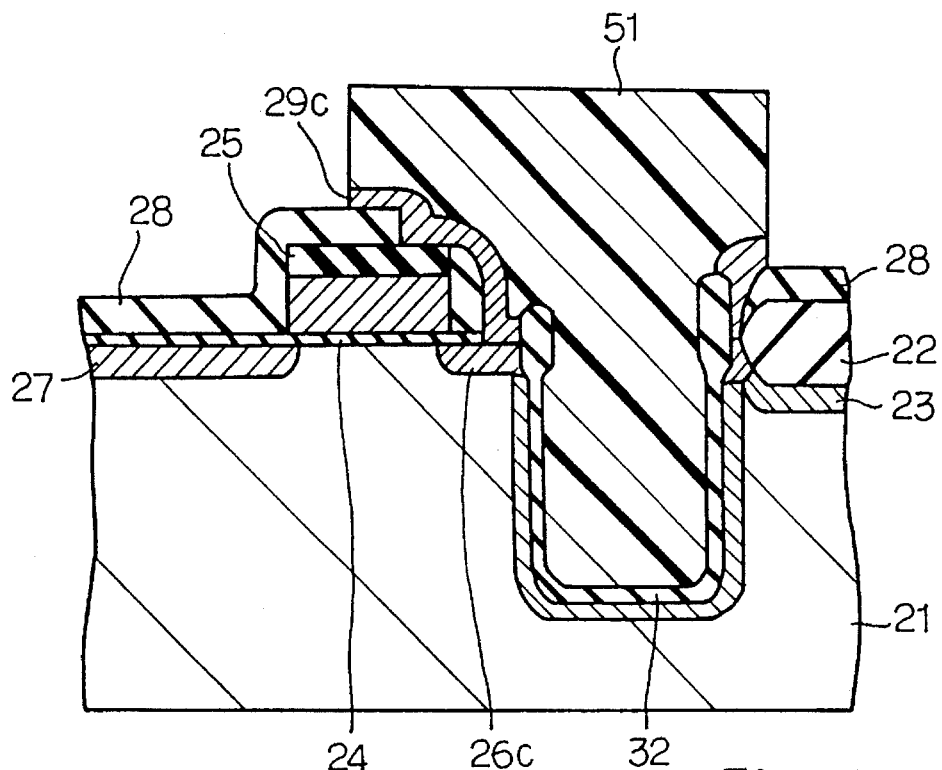
FIGS. 6A and 6B are cross sectional views showing essential stages of another process sequence according to the present invention.
Figure 6B:
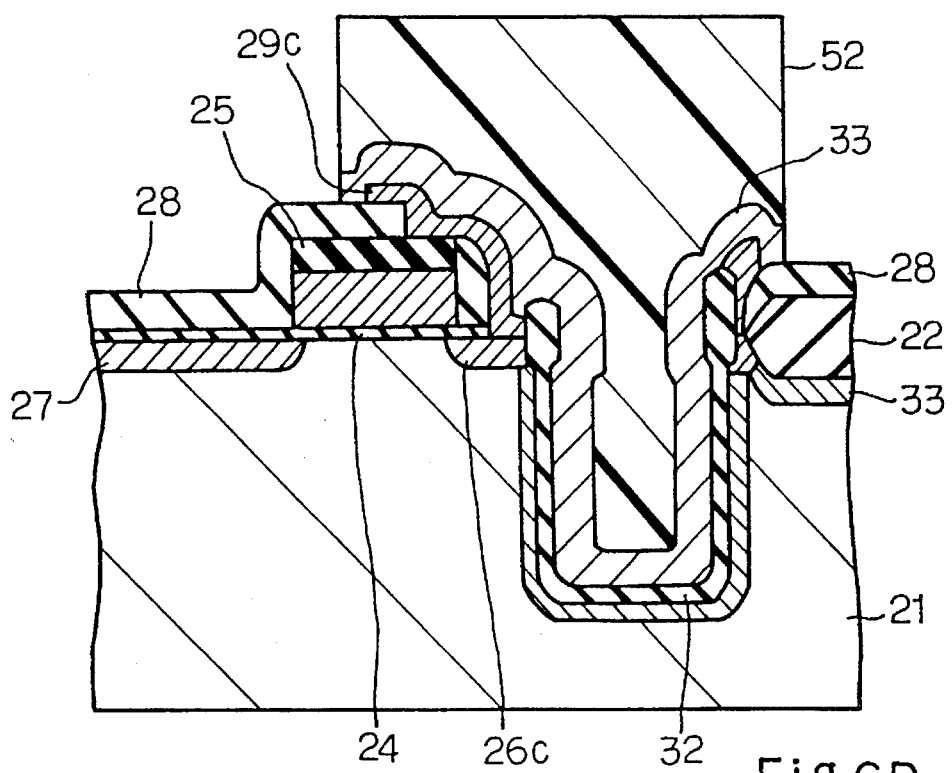

Subsequently, a photo-resist mask 51 is patterned for the first storage node electrode 29c, and exposed portions of the heavily-doped n-type polysilicon layer 42 are etched away for producing the first storage node electrode 29c as shown in FIG. 6A. The first storage node electrode 29c of the second embodiemnt is smaller than the first storage node electrode 29c of the first embodiment.

The photo-resist mask 51 is stripped off, and the heavily-doped n-type polysilicon layer is deposited over the entire surface of the structure. A photo-resist mask 52 is provided for the second storage node electrode 29c, and exposed portions of the heavily-doped n-type polysilicon layer are etched away for forming the second storage node electrode 33c. The second storage node electrode 33c of the second embodiemnt is as large as the second storage node electrode 33c of the first embodiemnt, and, for this reason, a step portion takes place for increasing the total amount of area covered with the dielectric film structure 43.

After the formation of the accumulating electrode, the process sequence of the second embodiment follows the remaining stages of the process sequence implementing the first embodiemnt, and no further desciption is incorproated hereinbelow for avoiding repetition.

The dynamic random access memory device implementing the second embodiemnt achieves all of the advantages described in connection with the first embodiment. Moreover, the accumulating electrode incorporated in the second embodiemnt increases the amout of electric charge without increase of the occupation area by virtue of the step portion between the first storage node electrode 29c and the second storage node electrode 33c.

Third Embodiment

Figure 7:
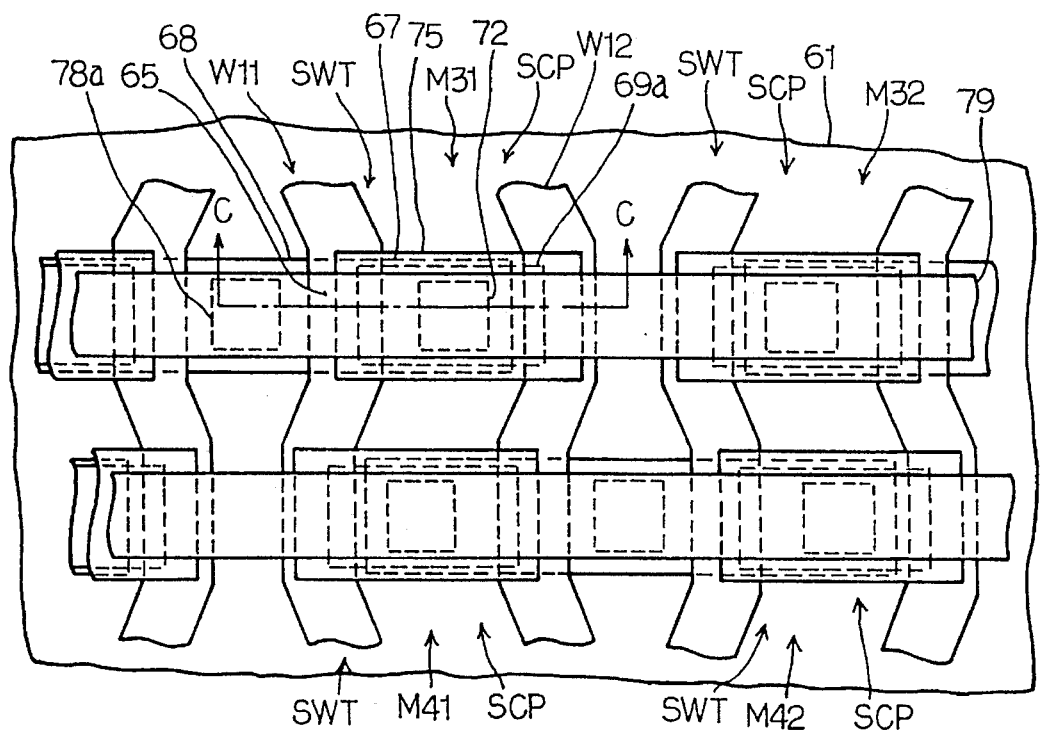
FIG. 7 is a schematic plan view showing the layout of parts of a memory cell array incorporated in another dynamic random access memory device according to the present invention.
Figure 8:
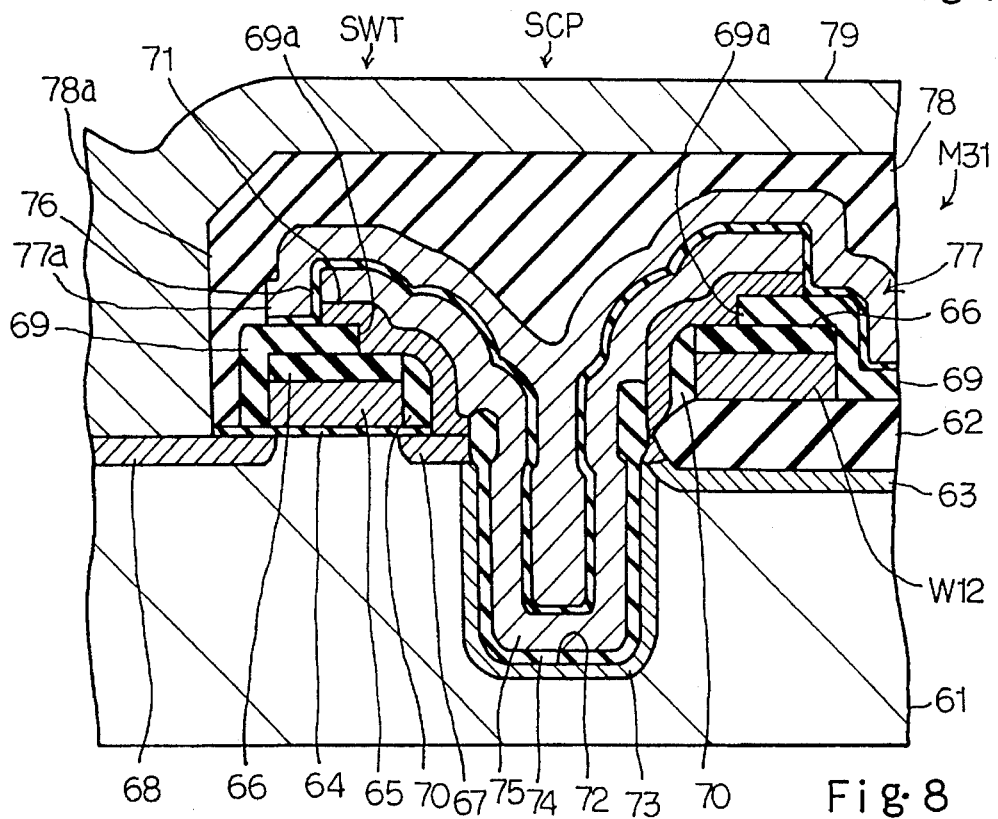
FIG. 8 is a cross sectional view taken along line C—C of FIG. 7 and showing the structure of one of the memory cells incorporated in the dynamic random access memory device.

Turning to FIGS. 7 and 8 of the drawings, yet another dynamic random access memory device embodying the present invention is fabricated on a p-type silicon substrate 61, and a foled bit line system is incorporated in the dynamic random access memory device. The dynamic random access memory device is designed under the 0.5-micron design rules, and the margin for the mask alignment is ±0.05 micron. FIG. 7 illustrates the layout of the dynamic random access memory device, and inter-level insulating films and a cell plate electrode are deleted from the layout for the sake of simplicity.

The dynamic random access memory device comprises a memory cell array having memory cells M31, M32, M41 and M42, and each of the memory cells M31 to M42 is implemented by a series combination of an n-channel enhancement type switching transistor SWT and a trench-stacked type storage capacitor SCP. All of the memory cells are similar in structure, and, for this reason, only the memory cell M31 is described hereinbelow.

The p-type silicon substrate 61 has a major surface, and a thick field oxide film 62 is selectively grown for defining an active area assigned to the memory cell M31. The thick field oxide film 62 electrically isolates the active area from other active areas assigned to other components together with a heavily-doped p-type channel stopper region 63 beneath the thick field oxide film 62. The active area is covered with a thin gate oxide film 64, and word lines W11 and W12 extend in parallel over the thick field oxide film 62 and the thin gate oxide film 64. A part of the word line W11 on the thin gate oxide film 64 serves as a gate electrode 65 of the n-channel enhancement type switching transistor SWT. The gate electrode 65 of the n-channel enhancement type switching transistor SWT is 0.5 micron in width, and, accordingly, the n-channel enhancement type switching transistor has a channel length of 0.5 micron.

The word lines W11 and W12 are overlain by first insulating layers 66 of silicon oxide, respectively, and a heavily-doped n-type source region 67 and a heavily-doped n-type drain region 68 are formed on both sides of the gate electrode 65 in a self-aligned manner. Each of the heavily-doped n-type source region 67 and the heavily-doped n-type drain region 68 has a lateral length of 0.8 micron in a direction parallel to the gate width and a depth of 0.2 micron. The heavily-doped n-type source region 67 is spaced apart from the heavily-doped n-type source region of the memory cell M41 by 0.6 micron and from the heavily-doped n-type source region of the memory cell M32 by 1.2 microns.

A second insulating film 69 of silicon oxide covers parts of the first insulating films 66, exposed portion of the gate oxide film 64 and exposed portion of the thick field oxide film 62, and a contact hole 69a is formed in the second insulating film 69. The contact hole 69a extends between the remaining part of the first insulating film 66 on the gate electrode 65 and a part of the first insulating film 66 on the word line W12, and a side spacer 70 is provided on a side surface of the word line W11. The second insulating film 69 and the side spacers 70 are concurrently formed from a silicon oxide film through an anisotropical etching.

A first storage node electrode 71 of heavily-doped n-type polysilicon extends from the second insulating film 69 over the gate electrode 56 through the first insulating film 66 on the gate electrode 65, the side spacer 70 for the gate electrode 65, the heavily-doped n-type source region 67, the side spacer 70 for the word line W12, the first insulating film 66 on the word line W12 to the second insulating film 69 over the word line W12, and is 50 nanometers thick. The inner periphery of the first storage node electrode 71 is self-aligned with the inner periphery of the heavily-doped n-type source region 67.

A primary trench 72 projects through the first storage node electrode 71 and the heavily-doped n-type source region 67 into the p-type silicon substrate 61, and occupies an area of 0.5 micron×0.5 micron. The primary trench 72 is 3 microns in depth. The margins between the primary trench 72 and the word lines W11 and W12 are 0.3 micron and 0.2 micron, and the margin between the primary trench 72 and the outer periphery of the heavily-doped n-type source region 67 is 0.15 micron.

A heavily-doped p-type channel stopper 73 is formed along the inner wall of the primary trench 72, and the inner wall is covered with an isolation layer 74 of silicon oxide. The isolation layer 74 is formed through oxidation of the inner wall portion defining the primary trench 72, and an extremely narrow gap between the side spacer 70 and the isolation layer 74 is defined without lithographic techniques. The isolation layer 74 defines a secondary trench in the primary trench 72.

A second storage node electrode 75 extends partially in the secondary trench and partially on the first storage node electrode 71, and, for this reason, the second storage node electrode 75 is electrically connected with the heavily-doped n-type source region 67 through the first storage node electrode 71. The second storage node electrode 75 is formed from a heavily-doped n-type polysilicon layer, a refractory metal layer or a refractory metal silicide layer, and is of the order of 100 nanometers in thickness. The second storage node electrode 75 occupies a part of the real estate of 1.9 microns by 0.9 micron, and is spaced apart from the second storage node electrode of the adjacent memory cells M32 and M41 by 0.5 micron. The first and second storage node electrodes 71 and 75 form in combination an accumulating electrode, and the isolation layer 74 isolates the accumulating electrode from the p-type silicon substrate 61.

The accumulating electrode is covered with a dielectric film structure 76, and the dielectric film structure 76 is implemented by a single predetermined dielectric film or a lamination of different dielectric films. The dielectric film structure 76 is covered with a cell place electrode 77. An opening 77a is formed in the cell plate electrode 77 for an electrical connection between the heavily-doped n-type drain region 68 and a bit line 79.

An inter-level insulating film 78 covers the cell plate electrode 77, and a contact hole 78a is formed in the inter-level insulating film 78. The contact hole 78a measures 0.5 micron by 0.5 micron, and the margins from the contact hole 78a to the gate electrode 65 and to the outer periphery of the heavily-doped n-type drain region 68 are 0.2 micron and 0.15 micron, respectively. The bit line 79 of aluminum or aluminum alloy extends over the inter-level insulating film 78, and is held in contact with the heavily-doped n-type drain region 68 through the contact hole 78a.

The heavily doped n-type source region 67, the heavily-doped n-type drain region 68, the gate oxide film 64 and the gate electrode 65 form in combination the n-channel enhancement type switching transistor SWT, and the first and second storage node electrodes 71 and 75, the dielectric film structure 76 and the cell plate electrode 77 as a whole constitute the trench-stacked type storage capacitor SCP.

The dynamic random access memory device implementing the third embodiment is fabricated through a process sequence similar to that of the first and second embodiments, and detailed description is omitted for the sake of simplicity. As described hereinbefore, the first storage electrode 71 is connected with the heavily-doped n-type source region 67 through the extremely narrow gap formed without the lithographic techniques, and each memory cell occupies a part of the real estate measuring 2.75 microns by 1.4 microns. Thus, even if the folded bit line system is employed, the memory cell is smaller than the memory cell of the prior art trench-stacked type storage capacitor.

Moreover, the isolation layer 74 prevents the accumulating electrode from the problem inherent in the prior art trench-type storage capacitor.

In the third embodiment, the outer periphery of the first storage node electrode 71 is aligned with the outer periphery of the second storage node electrode 77. However, a step may be formed between the outer periphery of the first storage node electrode 71 and the outer periphery of the second storage node electrode 77.

Although particular embodiments of the present invention have been shown and described, it will be obvious to those skilled in the art that various changes and modifications may be made without departing from the spirit and scope of the present invention.

What is claimed is:

1. A process of fabricating a memory cell having a switching transistor and a trench-stacked storage capacitor coupled in series with said switching transistor, comprising the steps of:

a) preparing a semiconductor substrate, of a first conductivity type having an active area on a major surface thereof;

b) fabricating said switching transistor on said active area, said switching transistor having a gate insulating film covering a part of said active area, a gate electrode formed on said gate insulating film and overlain by a first insulating film, a source region of a second conductivity type opposite to said first conductivity type and a drain region of said second conductivity type, said source region and said drain region being formed on both sides of said part of said active area, respectively; then c) depositing a second insulating film on an entire surface of said semiconductor substrate, said second insulating film extending over said source region, a side surface of said gate electrode and said first insulating film;

d) anisotropically etching said second insulating film until said source region is exposed, a side spacer being formed from said second insulating film, said side spacer covering said side surface of said gate electrode over said source region;

e) depositing a first conductive layer extending along said side spacer and held in contact with said source region;

f) providing a mask exposing a part of said first conductive layer over a part of said source region;

g) successively etching said first conductive layer, said source region and said semiconductor substrate by using said mask for forming a primary trench nested with said source region;

h) growing an isolation layer on a wall portion of said semiconductor substrate defining said primary trench, a peripheral surface of said source region exposed to said primary trench, and a peripheral surface of said first conductive layer also exposed to said primary trench; whereby a gap is defined between said side spacer and said isolation layer, and wherein said first conductive layer contacts said source region through said gap;

i) removing said mask for exposing said first conductive layer;

j) forming an accumulating electrode partially in a secondary trench defined by said isolation layer, so that said first conductive layer couples said accumulating electrode to said source region through said gap;

k) covering said accumulating electrode with a dielectric film structure; and l) forming a cell plate electrode held in contact with said dielectric film structure for completing said trench-stacked storage capacitor.

2. The process as set forth in claim 1, in which said mask has a composite mask structure against oxidation and a photo-resist mask over said composite mask structure, said step h) comprising the sub-steps of h-1) removing said photo-resist mask for exposing said composite mask structure against oxidation, and h-2) oxidizing said wall portion of said semiconductor substrate, said peripheral surface of said source region and said peripheral surface of said first conductive layer for thermally growing said isolation layer.

3. The process as set forth in claim 1, in which further comprising the step of introducing a dopant impurity of said first conductivity type into said wall portion of said semiconductor substrate between said step g) and said step h) for forming a channel stopper along said primary trench.

4. The process as set forth in claim 3, in which said channel stopper is formed through an oblique ion implantation while said semiconductor substrate is driven for rotation.

5. The process as set forth in claim 1, in which said step h) comprises the sub-steps of h-1) depositing a dielectric layer over the entire surface, said dielectric layer extending along said wall portion defining said primary trench, said dielectric layer defining said secondary trench, h-2) forming a photo-resist film over the entire surface until a smooth surface is created, said secondary trench being filled with a block of photo-resist, h-3) uniformly etching said photo-resist film for exposing said dielectric layer on said mask, said secondary trench being filled with said block of photo-resist, and h-4) removing said dielectric layer on said mask and said block of photo-resist.

6. The process as set forth in claim 1, in which said step j) comprises the sub-steps of j-1) depositing a second conductive layer on the entire surface, said second conductive layer extending along said isolation layer and said first conductive layer, j-2) providing another mask on said second conductive layer for defining said accumulating electrode, and j-3) concurrently patterning said first and second conductive layers for forming said accumulating electrode partially in said secondary trench and partially on said side spacer.

7. The process as set forth in claim 1, in which said step j) comprises the sub-steps of j-1) providing another mask on said first conductive layer, j-2) partially etching said first conductive layer, said first conductive layer held in contact with said source region through said gap, j-3) removing said another mask, then j-4) depositing a second conductive layer over the entire surface, said second conductive layer extending over said isolation layer and said first conductive layer, j-5) providing yet another mask on said second conductive layer, said yet another mask covering a part of said second conductive layer wider than said first conductive layer, and j-6) partially etching said second conductive layer for forming said accumulating electrode.

8. A process of fabricating a memory cell having a switching transistor and a trench-stacked storage capacitor coupled in series with said switching transistor, comprising the steps of:

a) preparing a p-type silicon substrate having an active area on a major surface thereof;

b) fabricating said switching transistor on said active area, said switching transistor having a gate insulating film covering a part of said active area, a gate electrode formed on said gate insulating film and overlain by a first insulating film, an n-type source region and an n-type drain region, said n-type source region and said n-type drain region being formed on both sides of said part of said active area, respectively; then c) depositing a second insulating film on an entire surface of said silicon substrate, said second insulating film extending over said n-type source region, a side surface of said gate electrode and said first insulating film;

d) anisotropically etching said second insulating film until said n-type source region is exposed, a side spacer being formed from said second insulating film, said side spacer covering said side surface of said gate electrode over said n-type source region;

e) depositing a first n-type doped polysilicon layer extending along said side spacer and held in contact with said n-type source region;

f) providing a mask exposing a part of said first n-type doped polysilicon layer over a part of said n-type source region, said mask having a composite mask structure against oxidation and a photo-resist mask over said composite mask structure;

g) successively etching said first n-type doped polysilicon layer, said n-type source region and said p-type silicon substrate by using said mask for forming a primary trench nested with said n-type source region;

h) obliquely ion implanting a p-type dopant impurity into a wall portion of said p-type silicon substrate defining said primary trench while said p-type silicon substrate is driven for rotation, thereby forming a p-type channel stopper region in said wall portion;

i) removing said photo-resist mask for exposing said composite mask structure, j) oxidizing a surface portion of said p-type channel stopper region, a peripheral surface portion of said n-type source region exposed to said primary trench and a peripheral surface portion of said first n-type doped polysilicon layer exposed to said primary trench for thermally growing an isolation layer;

k) removing said composite mask structure for exposing said first n-type doped polysilicon layer; then l) depositing a second n-type doped polysilicon layer on the entire surface, said second n-type doped polysilicon layer extending along said isolation layer and said first n-type doped polysilicon layer, m) providing another photo-resist mask on said second n-type doped polysilicon layer for defining an accumulating electrode, and n) concurrently patterning said first and second n-type doped polysilicon layers for forming said accumulating electrode partially in a secondary trench defined by said isolation layer in said primary trench and partially on said side spacer;

o) covering said accumulating electrode with a dielectric film structure; and p) forming a cell plate electrode held in contact with said dielectric film structure for completing said trench-stacked storage capacitor.

9. A process of fabricating a memory cell having a switching transistor and a trench-stacked storage capacitor coupled in series with said switching transistor, comprising the steps of:

a) preparing a p-type silicon substrate having an active area on a major surface thereof;

b) fabricating said switching transistor on said active area, said switching transistor having a gate insulating film covering a part of said active area, a gate electrode formed on said gate insulating film and overlain by a first insulating film, an n-type source region and an n-type drain region, said n-type source region and said n-type drain region being formed on both sides of said part of said active area, respectively, then c) depositing a second insulating film on an entire surface of said silicon substrate, said second insulating film extending over said n-type source region, a side surface of said gate electrode and said first insulating film;

d) anisotropically etching said second insulating film until said n-type source region is exposed, a side spacer being formed from said second insulating film, said side spacer covering said side surface of said gate electrode over said n-type source region;

e) depositing a first n-type doped polysilicon layer extending along said side spacer and held in contact with said n-type source region;

f) providing a mask exposing a part of said first n-type doped polysilicon layer over a part of said n-type source region, said mask having a composite mask structure against oxidation and a photo-resist mask over said composite mask structure;

g) successively etching said first n-type doped polysilicon layer, said n-type source region and said p-type silicon substrate by using said mask for forming a primary trench nested with said n-type source region;

h) obliquely ion implanting a p-type dopant impurity into a wall portion of said p-type silicon substrate defining said primary trench while said p-type silicon substrate is driven for rotation, thereby forming a p-type channel stopper region in said wall portion;

i) removing said photo-resist mask for exposing said composite mask structure, j) oxidizing a surface portion of said p-type channel stopper region, a peripheral surface portion of said n-type source region exposed to said primary trench and a peripheral surface portion of said first n-type doped polysilicon layer exposed to said primary trench for thermally growing an isolation layer;

k) removing said composite mask structure for exposing said first n-type doped polysilicon layer;

l) providing another photo-resist mask on said first n-type doped polysilicon layer;

m) partially etching said first n-type doped polysilicon layer, said first n-type doped polysilicon layer held in contact with said n-type source region through a gap;

n) removing said another photo-resist mask; then o) depositing a second n-type doped polysilicon layer over the entire surface, said second n-type doped polysilicon layer extending over said isolation layer and said first n-type doped polysilicon layer;

p) providing yet another photo-resist mask on said second n-type doped polysilicon layer, said yet another photo-resist mask covering a part of said second n-type doped polysilicon layer wider than said first n-type doped polysilicon layer;

q) partially etching said second n-type doped polysilicon layer for forming an accumulating electrode together with said first n-type doped polysilicon layer;

r) removing said yet another photo-resist mask;

s) covering said accumulating electrode with a dielectric film structure; and t) forming a cell plate electrode held in contact with said dielectric film structure for completing said trench-stacked storage capacitor.

* * * * *